(12) United States Patent
Miyamoto et al.

(10) Patent No.: US 11,043,933 B2
(45) Date of Patent: Jun. 22, 2021

(54) NOTCH FILTER

(71) Applicant: Murata Manufacturing Co., Ltd., Nagaokakyo (JP)

(72) Inventors: Koji Miyamoto, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

(21) Appl. No.: 16/548,894

(22) Filed: Aug. 23, 2019

(65) Prior Publication Data

US 2019/0379351 A1 Dec. 12, 2019

Related U.S. Application Data

(63) Continuation of application No. PCT/JP2018/007180, filed on Feb. 27, 2018.

(30) Foreign Application Priority Data

Mar. 13, 2017 (JP) .............................. JP2017-047417

(51) Int. Cl.
*H03H 9/54* (2006.01)
*H03H 9/13* (2006.01)
*H03H 9/17* (2006.01)

(52) U.S. Cl.
CPC ............ *H03H 9/547* (2013.01); *H03H 9/132* (2013.01); *H03H 9/17* (2013.01)

(58) Field of Classification Search
CPC .......... H03H 9/547; H03H 9/132; H03H 9/17; H03H 9/6483; H03H 9/6409; H03H 9/02574
(Continued)

(56) References Cited

U.S. PATENT DOCUMENTS

| 6,025,763 A | 2/2000 | Morimoto |
| 6,326,864 B1 | 12/2001 | Takamine et al. |
| 2018/0123565 A1 | 5/2018 | Takamine |

FOREIGN PATENT DOCUMENTS

| JP | 09-246913 A | 9/1997 |
| JP | 11-220354 A | 8/1998 |

(Continued)

OTHER PUBLICATIONS

Machine English Translation of JPH11220354A Published on Aug. 10, 1999 (Year: 1999).*

(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A notch filter includes a substrate having piezoelectricity, the substrate including a high-acoustic-velocity member, a low-acoustic-velocity film provided on the high-acoustic-velocity member, and a piezoelectric thin film provided on the low-acoustic-velocity film; an interdigital transducer electrode provided on the piezoelectric thin film; and reflectors provided on both sides of the interdigital transducer electrode in an acoustic wave propagation direction. An IR gap is within one of two ranges: $0.1\lambda \leq G_{IR} < 0.5\lambda$ or $0.5\lambda < G_{IR} \leq 0.9\lambda$, where $\lambda$ is a wavelength determined by an electrode finger pitch of the interdigital transducer electrode, and the IR gap is a distance between electrode finger centers of an electrode finger of the interdigital transducer electrode closest to the reflector out of the electrode fingers of the interdigital transducer electrode, and an electrode finger of the reflector closest to the interdigital transducer electrode, out of the electrode fingers of the reflector.

13 Claims, 17 Drawing Sheets

(58) Field of Classification Search
USPC .......................................... 333/133, 193–196
See application file for complete search history.

(56) References Cited

FOREIGN PATENT DOCUMENTS

| | | |
|---|---|---|
| JP | 2000-261288 A | 9/2000 |
| JP | 2002-252548 A | 9/2002 |
| JP | 2012-257050 A | 12/2012 |
| WO | 2016/208677 A1 | 12/2016 |

OTHER PUBLICATIONS

Official Communication issued in International Patent Application No. PCT/JP2018/007180 dated May 15, 2018.

* cited by examiner

NOTCH FILTER

CROSS REFERENCE TO RELATED APPLICATIONS

This application claims the benefit of priority to Japanese Patent Application No. 2017-047417 filed on Mar. 13, 2017 and is a Continuation Application of PCT Application No. PCT/JP2018/007180 filed on Feb. 27, 2018. The entire contents of each application are hereby incorporated herein by reference.

BACKGROUND OF THE INVENTION

1. Field of the Invention

The present invention relates to notch filters.

2. Description of the Related Art

Japanese Unexamined Patent Application Publication No. 2012-257050 discloses an example of a notch filter that uses a surface acoustic wave. The notch filter includes a plurality of acoustic wave resonators formed on a piezoelectric substrate.

For example, in a prior art notch filter that uses a piezoelectric substrate made of $LiTaO_3$, a stopband response, which is a response attributed to an upper end of a stopband, is difficult to occur within a passband. Here, the stopband is a range where the wavelength of an acoustic wave is constant or substantially constant due to confinement of the acoustic wave within a grating. On the other hand, in the case where the notch filter includes a multilayer body in which a piezoelectric thin film, a low-acoustic-velocity film, and a high-acoustic-velocity member are stacked on top of each other, Q-value is high, and device characteristics are excellent. However, the stopband response also tends to be larger. Therefore, ripples in the passband tend to be larger.

SUMMARY OF THE INVENTION

Preferred embodiments of the present invention provide notch filters that each significantly reduce or prevent a stopband response in a passband and also significantly reduce or prevent ripples.

A notch filter according to a preferred embodiment of the present invention includes a substrate having piezoelectricity, the substrate including a high-acoustic-velocity member, a low-acoustic-velocity film provided on the high-acoustic-velocity member, and a piezoelectric thin film provided on the low-acoustic-velocity film; an interdigital transducer electrode provided on the piezoelectric thin film of the substrate having piezoelectricity; and reflectors provided on both sides of the interdigital transducer electrode in an acoustic wave propagation direction on the piezoelectric thin film of the substrate having piezoelectricity, wherein an acoustic velocity of a bulk wave propagating in the low-acoustic-velocity film is lower than an acoustic velocity of an acoustic wave propagating in the piezoelectric thin film, an acoustic velocity of a bulk wave propagating in the high-acoustic-velocity member is higher than the acoustic velocity of an acoustic wave propagating in the piezoelectric thin film, the interdigital transducer electrode and the reflectors each include electrode fingers, and an IR gap $G_{IR}$ is within one of two ranges: $0.1\lambda \leq G_{IR} < 0.5\lambda$ or $0.5\lambda < G_{IR} \leq 0.9\lambda$, where $\lambda$ is a wavelength determined by an electrode finger pitch of the interdigital transducer electrode, and the IR gap $G_{IR}$ is a distance between electrode finger centers of an electrode finger of the interdigital transducer electrode closest to the reflector, of the electrode fingers of the interdigital transducer electrode, and an electrode finger of the reflector closest to the interdigital transducer electrode, of the electrode fingers of the reflector.

In a notch filter according to a preferred embodiment of the present invention, the IR gap $G_{IR}$ is within one of two ranges: $0.4\lambda \leq G_{IR} < 0.5\lambda$ or $0.5\lambda < G_{IR} \leq 0.6\lambda$. In this case, the interdigital transducer electrode and the reflector are able to be easily produced, thus increasing productivity.

In a notch filter according to a preferred embodiment of the present invention, the IR gap $G_{IR}$ is within one of two ranges: $0.2\lambda \leq G_{IR} 0.4\lambda$ or $0.6\lambda \leq G_{IR} \leq 0.8\lambda$. In this case, in the passband, ripples are able to be further significantly reduced or prevented.

In a notch filter according to a preferred embodiment of the present invention, the number of the electrode fingers of the reflector is 21 or less. In this case, in the passband, ripples are able to be further significantly reduced or prevented.

In a notch filter according to a preferred embodiment of the present invention, $0.91\lambda \leq \lambda_R \leq 5\lambda$ is satisfied, where $\lambda_R$ is a wavelength determined by an electrode finger pitch of the reflector. In this case, in the passband, ripples are able to be further significantly reduced or prevented.

In a notch filter according to a preferred embodiment of the present invention, the high-acoustic-velocity member includes a supporting substrate and a high-acoustic-velocity film provided on the supporting substrate, an acoustic velocity of a bulk wave propagating in the high-acoustic-velocity film being higher than an acoustic velocity of an acoustic wave propagating in the piezoelectric thin film.

The preferred embodiments of the present invention provide notch filters that each significantly reduces or prevents a stopband response in a passband and also significantly reduces or prevents ripples.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention is disclosed in detail by describing specific preferred embodiments of the present invention with reference to the drawings.

Each preferred embodiment described in the present specification is for illustrative purposes only, and components and elements of different preferred embodiments may be partially exchanged or combined.

Figure 1:
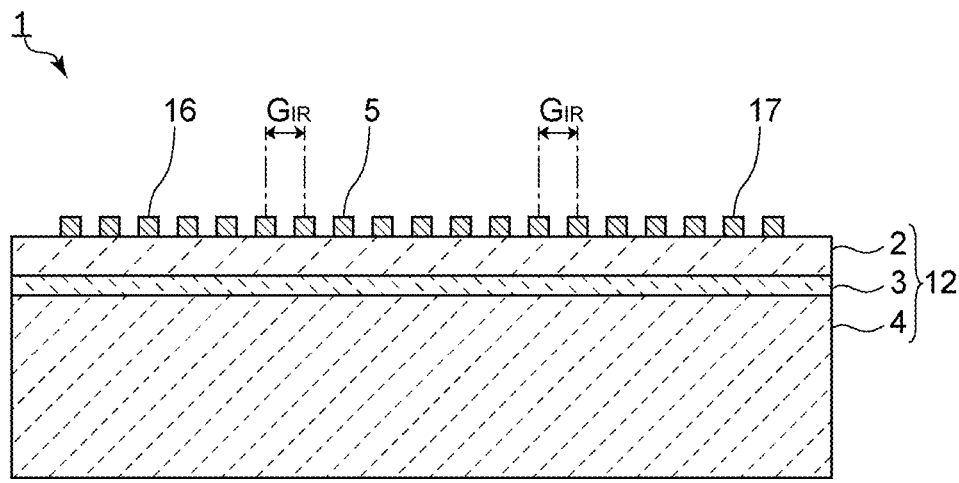
FIG. 1 is a front cross-section diagram of a notch filter according to a first preferred embodiment of the present invention.

FIG. 1 is a front cross-section diagram of a notch filter according to a first preferred embodiment of the present invention.

A notch filter 1 includes a substrate 12 having piezoelectricity. The substrate 12 having piezoelectricity is a multilayer body including a high-acoustic-velocity member 4, a low-acoustic-velocity film 3 provided on the high-acoustic-velocity member 4, and a piezoelectric thin film 2 provided on the low-acoustic-velocity film 3. In the first preferred embodiment, the piezoelectric thin film 2 includes $LiTaO_3$. Alternatively, the piezoelectric thin film 2 may include piezoelectric single crystal other than $LiTaO_3$, for example, $LiNbO_3$ or the like.

The low-acoustic-velocity film 3 is a film in which the acoustic velocity of a bulk wave propagating therein is lower than the acoustic velocity of an acoustic wave propagating in the piezoelectric thin film 2. In the first preferred embodiment, the low-acoustic-velocity film 3 preferably includes $SiO_2$, for example. Note that the low-acoustic-velocity film 3 may include, for example, a material including, as a main component, a compound prepared by adding fluorine, carbon, or boron to glass, silicon oxynitride, tantalum oxide, or silicon oxide, or a similar material. The material of the low-acoustic-velocity film 3 may be any material having a relatively lower acoustic velocity.

On the other hand, the high-acoustic-velocity member 4 is a member in which the acoustic velocity of a bulk wave propagating therein is higher than the acoustic velocity of an acoustic wave propagating in the piezoelectric thin film 2. In the first preferred embodiment, the high-acoustic-velocity member 4 is preferably a high-acoustic-velocity substrate including Si, for example. Alternatively, the high-acoustic-velocity member 4 may include a supporting substrate and a high-acoustic-velocity film provided on the supporting substrate. Note that the high-acoustic-velocity film is a film in which the acoustic velocity of a bulk wave propagating therein is higher than the acoustic velocity of an acoustic wave propagating in the piezoelectric thin film 2.

Alternatively, the high-acoustic-velocity member 4 may include, for example, a material including, as a main component, aluminum nitride, aluminum oxide, silicon carbide, silicon oxynitride, a DLC film, or diamond, or a similar material. The material of the high-acoustic-velocity member 4 may be any material having a relatively higher acoustic velocity.

An interdigital transducer electrode 5 is provided on the piezoelectric thin film 2. By applying an alternating-current voltage on the interdigital transducer electrode 5, an acoustic wave is excited. On the piezoelectric thin film 2, a reflector 16 and a reflector 17 are provided on both sides of the interdigital transducer electrode 5 in an acoustic wave propagation direction.

As described above, the notch filter 1 includes the multilayer body of the piezoelectric thin film 2, the low-acoustic-velocity film 3, and the high-acoustic-velocity member 4. Therefore, energy of acoustic wave is able to be effectively confined, thus improving the characteristics of the notch filter 1, for example, by reducing insertion loss in a passband while increasing attenuation in a stopband.

Figure 2:
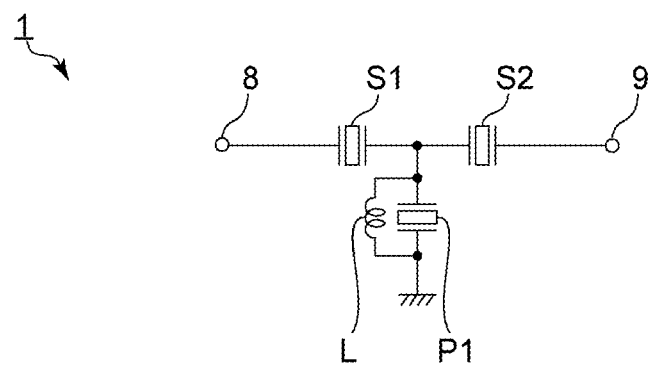
FIG. 2 is a circuit diagram of a notch filter according to the first preferred embodiment of the present invention.

FIG. 2 is a circuit diagram of the notch filter according to the first preferred embodiment.

The notch filter 1 includes a first terminal 8 and a second terminal 9. In between the first terminal 8 and the second terminal 9, an acoustic wave resonator S1 and an acoustic wave resonator S2 are electrically connected to each other in series. In between a ground potential and a connection point between the acoustic wave resonator S1 and the acoustic wave resonator S2, an acoustic wave resonator P1 and an inductor L are electrically connected to each other in parallel. The specific circuitry of the notch filter 1 is not limited to the circuitry described above.

The acoustic wave resonator S1 is preferably a one-port acoustic wave resonator, for example, including the interdigital transducer electrode 5, the reflector 16, and the reflector 17 illustrated in FIG. 1. In the following, the acoustic wave resonator S1 is described more specifically.

Figure 3:
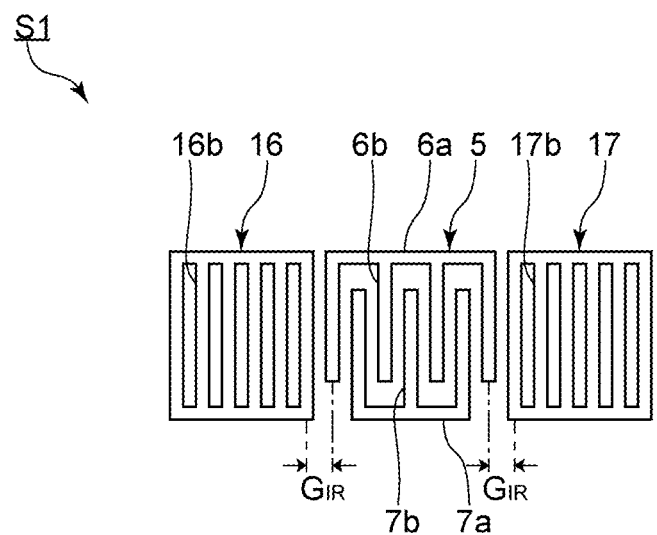
FIG. 3 is a schematic plan view illustrating electrodes of an acoustic wave resonator disposed on first terminal side in the first preferred embodiment of the present invention.

FIG. 3 is a schematic plan view illustrating electrodes of an acoustic wave resonator disposed on the first terminal side in the first preferred embodiment. Note that, in FIG. 3, wiring and the like connected to the interdigital transducer electrode are omitted.

As described above, the acoustic wave resonator S1 includes the interdigital transducer electrode 5, the reflector 16, and the reflector 17. The interdigital transducer electrode 5 includes a first busbar 6a and a second busbar 7a, which face each other. The interdigital transducer electrode 5 includes a plurality of first electrode fingers 6b each connected to the first busbar 6a at one end portion thereof. Further, the interdigital transducer electrode 5 includes a plurality of second electrode fingers 7b each connected to the second busbar 7a at one end portion thereof. The plurality of first electrode fingers 6b and the plurality of second electrode fingers 7b interlock with each other. The reflector 16 also includes a plurality of electrode fingers 16b. Similarly, the reflector 17 includes a plurality of electrode fingers 17b.

The interdigital transducer electrode 5, the reflector 16, and the reflector 17 may be defined by a multilayer metal film in which a plurality of metal layers are stacked or from a single layer metal film. Similarly, the acoustic wave resonator S2 and the acoustic wave resonator P1 illustrated in FIG. 2 each also include an interdigital transducer electrode and reflectors.

Design parameters of the acoustic wave resonator S1, the acoustic wave resonator S2, and the acoustic wave resonator P1 are described in the following Table 1. The inductance of the inductor L illustrated in FIG. 2 is preferably about 2 nH, for example. Note that the inductance of the inductor L is not limited to the one described above. The design parameters of the acoustic wave resonator S1, the acoustic wave resonator S2, and the acoustic wave resonator P1 are not limited to values described in Table 1.

TABLE 1

|  | Acoustic Wave Resonator S1 | Acoustic Wave Resonator S2 | Acoustic Wave Resonator P1 |
| --- | --- | --- | --- |
| Wavelength of Interdigital transducer electrode (μm) | 1.546 | 1.619 | 1.567 |
| Wavelength of Reflector (μm) | 1.546 | 1.619 | 1.567 |
| Number of Electrode Fingers in Reflector (Number) | 21 | 21 | 21 |

Here, a distance between electrode finger centers of an electrode finger of the interdigital transducer electrode 5 closest to the reflector 16, of the first electrode fingers 6b and the second electrode fingers 7b of the interdigital transducer electrode 5, and an electrode finger of the reflector 16 closest to the interdigital transducer electrode 5, of the electrode fingers 16b of the reflector 16, is defined as an IR gap $G_{IR}$. Similarly, a distance between electrode finger centers of an electrode finger of the interdigital transducer electrode 5 closest to the reflector 17, of the first electrode fingers 6b and the second electrode fingers 7b of the interdigital transducer electrode 5, and an electrode finger of the reflector 17 closest to the interdigital transducer electrode 5, of the electrode fingers 17b of the reflector 17, is also defined as the IR gap $G_{IR}$. A wavelength determined by an electrode finger pitch of the interdigital transducer electrode 5 is defined as $\lambda$. In the first preferred embodiment, the IR gap $G_{IR}$ is the same or substantially the same on the reflector 16 side and the reflector 17 side. Alternatively, the IR gap $G_{IR}$ may not be necessarily the same or substantially the same on the reflector 16 side and the reflector 17 side.

A feature of the first preferred embodiment is to include the substrate 12 having piezoelectricity illustrated in FIG. 1 and to have the IR gap $G_{IR}$ within one of two ranges: $0.1\lambda \leq G_{IR} < 0.5\lambda$ or $0.5\lambda < G_{IR} \leq 0.9\lambda$. This feature significantly reduces or prevents a stopband response in the passband and also significantly reduces or prevents ripples. This is described below by comparing the first preferred embodiment with a first comparative example, a second comparative example, and a third comparative example.

Note that the first comparative example, the second comparative example, and the third comparative example are different from the first preferred embodiment in the IR gap $G_{IR}$. More specifically, the IR gap $G_{IR}$ of the first comparative example is about 0.5λ, the IR gap $G_{IR}$ of the second comparative example is about 0.01λ, and the IR gap $G_{IR}$ of the third comparative example is about 1λ.

Figure 4:
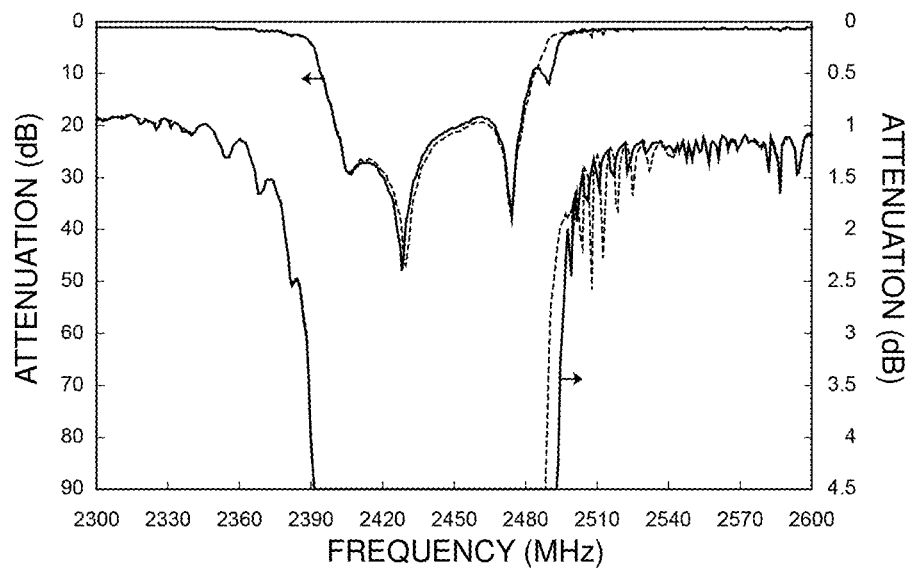
FIG. 4 is a diagram illustrating attenuation-frequency characteristics of the first preferred embodiment of the present invention, whose IR gap $G_{IR}$ is about $0.1\lambda$, and a first comparative example.

FIG. 4 is a diagram illustrating attenuation-frequency characteristics of the first preferred embodiment whose IR gap $G_{IR}$ is about 0.1λ and the first comparative example. In FIG. 4, the solid line represents a result of the first preferred embodiment, and the dashed line represents a result of the first comparative example.

As illustrated in FIG. 4, it is found that, in the first comparative example, larger ripples are generated in the passband on the higher frequency side than the stopband. An acoustic wave leaked from the interdigital transducer electrode in the acoustic wave propagation direction is reflected by the reflector toward the interdigital transducer electrode side. At that time, spurious emissions are generated. As with the first preferred embodiment, the notch filter of the first comparative example includes the multilayer body with the piezoelectric thin film, the low-acoustic-velocity film, and the high-acoustic-velocity member. Thus, Q-value is high, which provides high energy efficiency, but also makes the spurious emissions larger. Therefore, in the first comparative example, large ripples are generated in the passband.

On the other hand, as illustrated in FIG. 4, it is found that, in the first preferred embodiment, ripples are reduced to a greater extent in the passband on the higher frequency side than the stopband. In the first preferred embodiment, the IR gap $G_{IR}$ is within one of two ranges: $0.1\lambda \leq G_{IR} < 0.5\lambda$ or $0.5\lambda < G_{IR} \leq 0.9\lambda$. More specifically, in the case illustrated in FIG. 4, the IR gap $G_{IR}$ is about 0.1λ, thus significantly reducing or preventing the generation of spurious emissions at the time when an acoustic wave is reflected at the reflector and significantly reducing or preventing the stopband response. Accordingly, the ripples are able to be significantly reduced or prevented in the passband.

In the following, it is illustrated that the first preferred embodiment significantly reduces or prevents in the passband even when the IR gap $G_{IR}$ is other than about 0.1λ. Further, the second comparative example whose IR gap $G_{IR}$ is less than about 0.1λ and the third comparative example whose IR gap $G_{IR}$ is larger than about 0.9λ are also illustrated.

Figure 5:
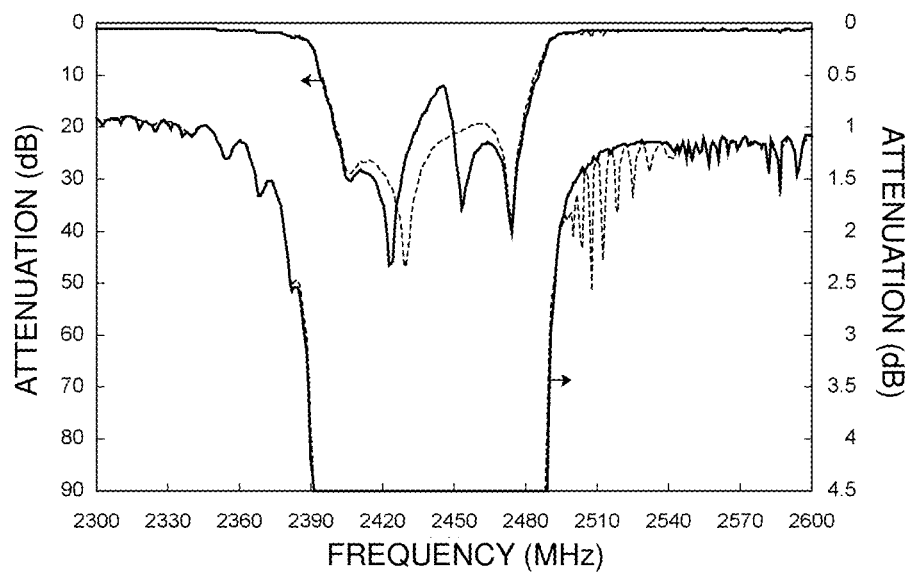
FIG. 5 is a diagram illustrating attenuation-frequency characteristics of the first preferred embodiment of the present invention, whose IR gap $G_{IR}$ is about $0.2\lambda$, and the first comparative example.
Figure 6:
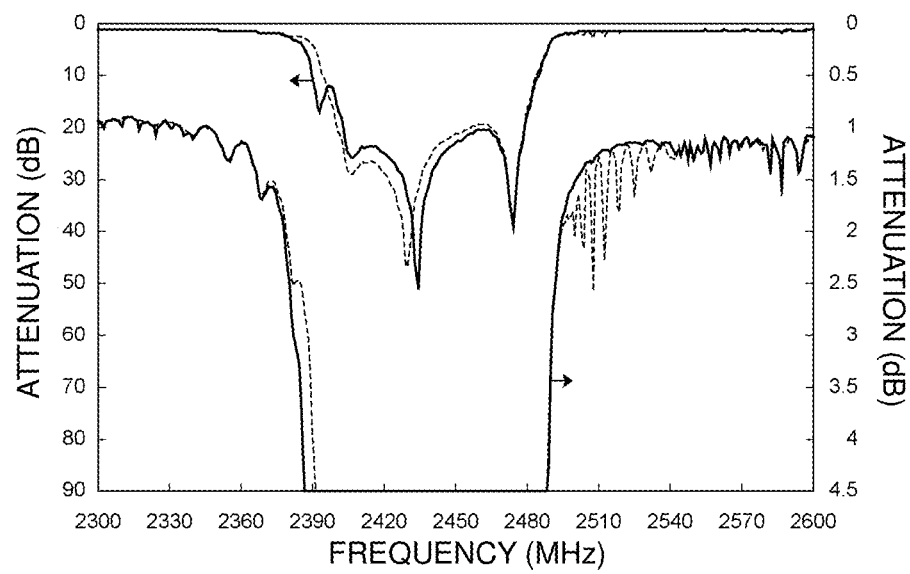
FIG. 6 is a diagram illustrating attenuation-frequency characteristics of the first preferred embodiment of the present invention, whose IR gap $G_{IR}$ is about $0.3\lambda$, and the first comparative example.
Figure 7:
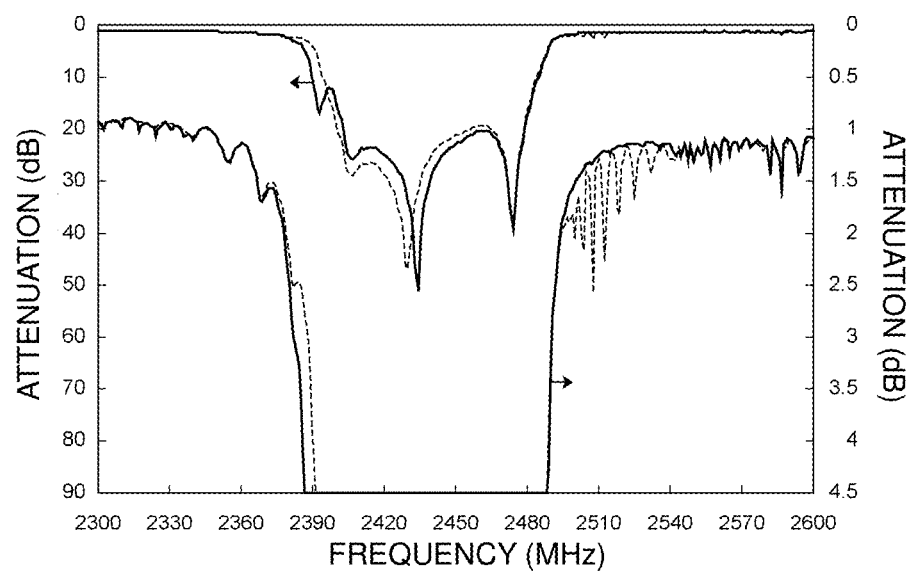
FIG. 7 is a diagram illustrating attenuation-frequency characteristics of the first preferred embodiment of the present invention, whose IR gap $G_{IR}$ is about $0.4\lambda$, and the first comparative example.
Figure 8:
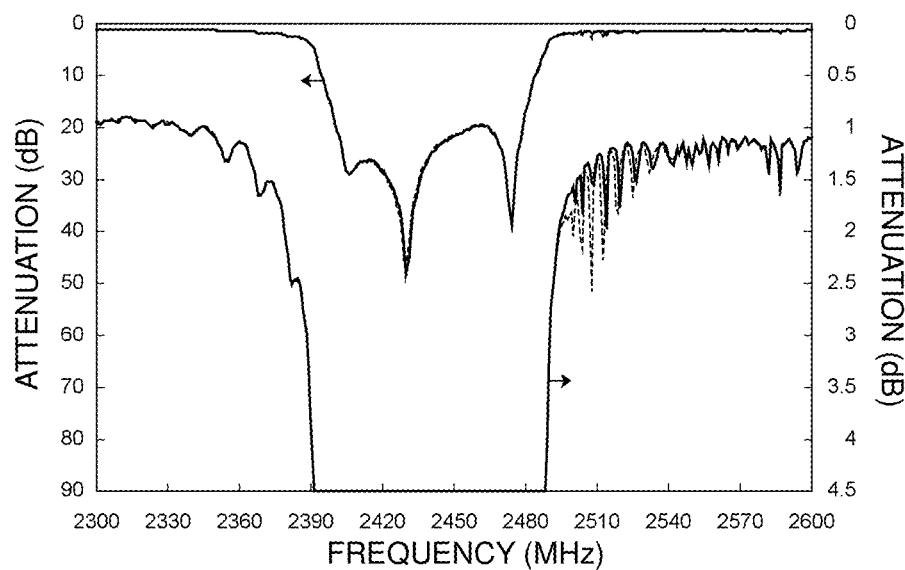
FIG. 8 is a diagram illustrating attenuation-frequency characteristics of the first preferred embodiment of the present invention, whose IR gap $G_{IR}$ is about $0.45\lambda$, and the first comparative example.
Figure 9:
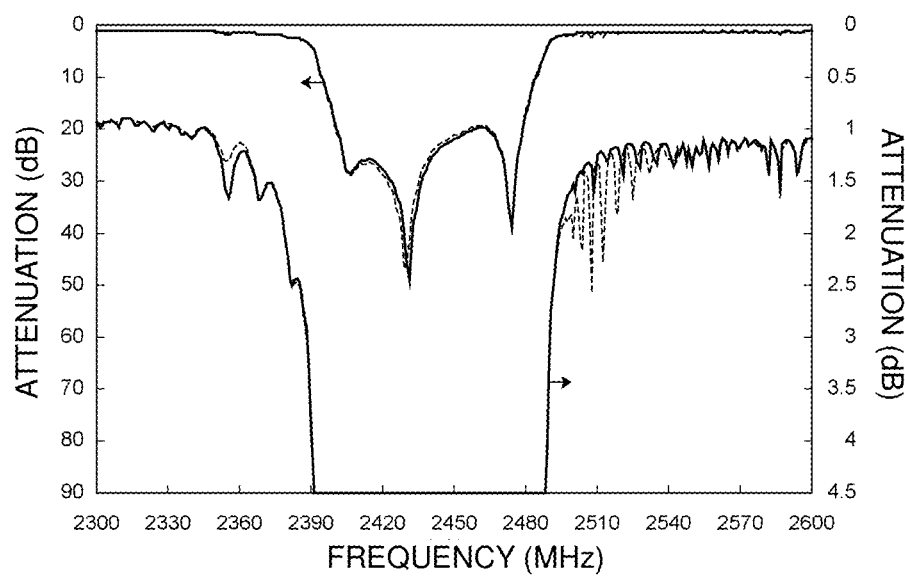
FIG. 9 is a diagram illustrating attenuation-frequency characteristics of the first preferred embodiment of the present invention, whose IR gap $G_{IR}$ is about $0.55\lambda$, and the first comparative example.
Figure 10:
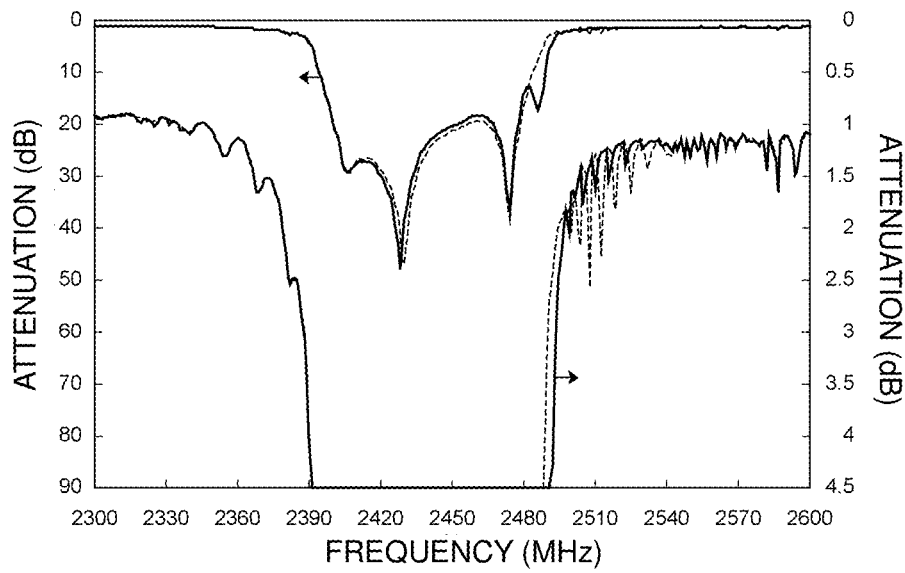
FIG. 10 is a diagram illustrating attenuation-frequency characteristics of the first preferred embodiment of the present invention, whose IR gap $G_{IR}$ is about $0.6\lambda$, and the first comparative example.
Figure 11:
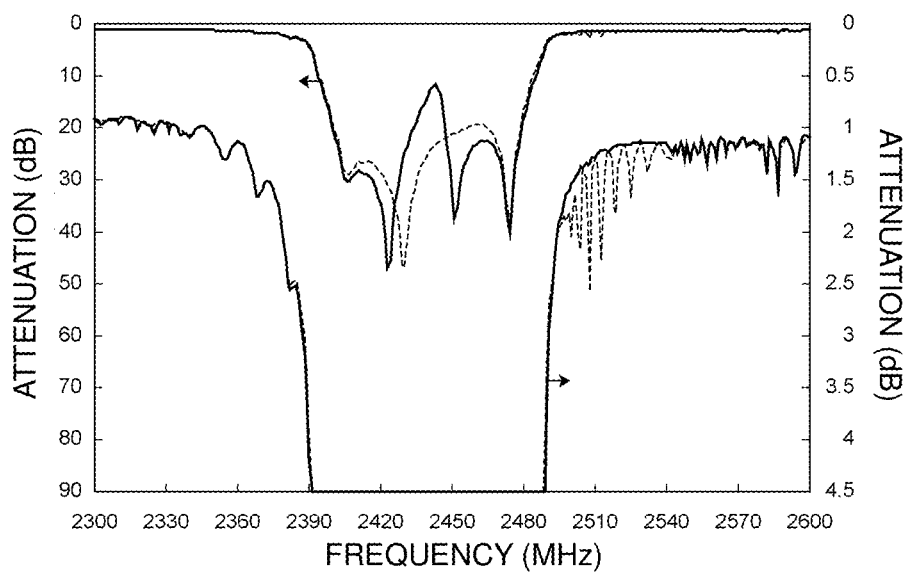
FIG. 11 is a diagram illustrating attenuation-frequency characteristics of the first preferred embodiment of the present invention, whose IR gap $G_{IR}$ is about $0.7\lambda$, and the first comparative example.
Figure 12:
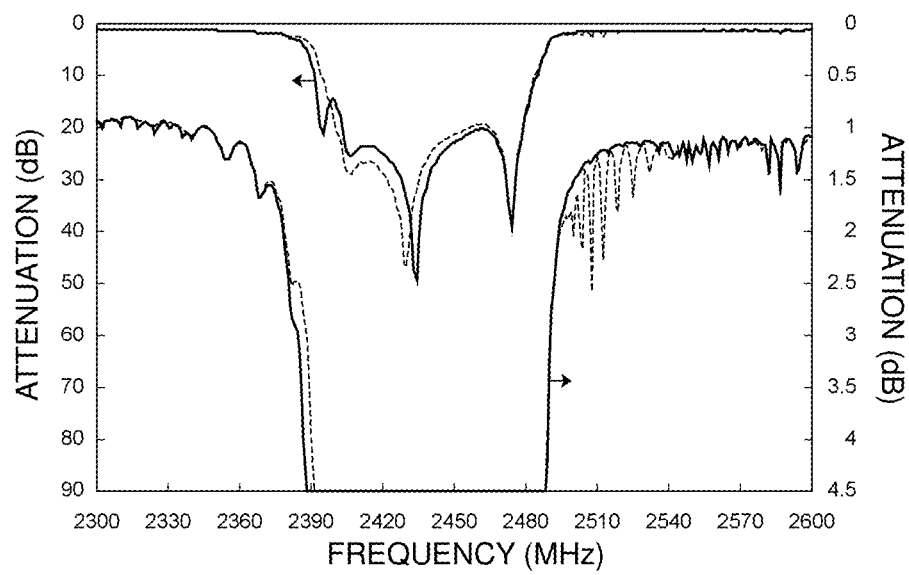
FIG. 12 is a diagram illustrating attenuation-frequency characteristics of the first preferred embodiment of the present invention, whose IR gap $G_{IR}$ is about $0.8\lambda$, and the first comparative example.
Figure 13:
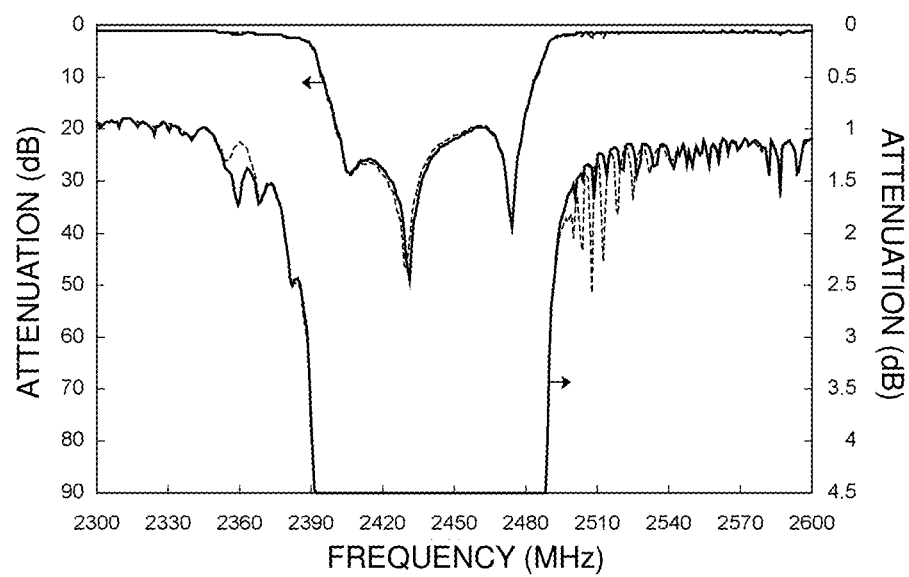
FIG. 13 is a diagram illustrating attenuation-frequency characteristics of the first preferred embodiment of the present invention, whose IR gap $G_{IR}$ is about $0.9\lambda$, and the first comparative example
Figure 14:
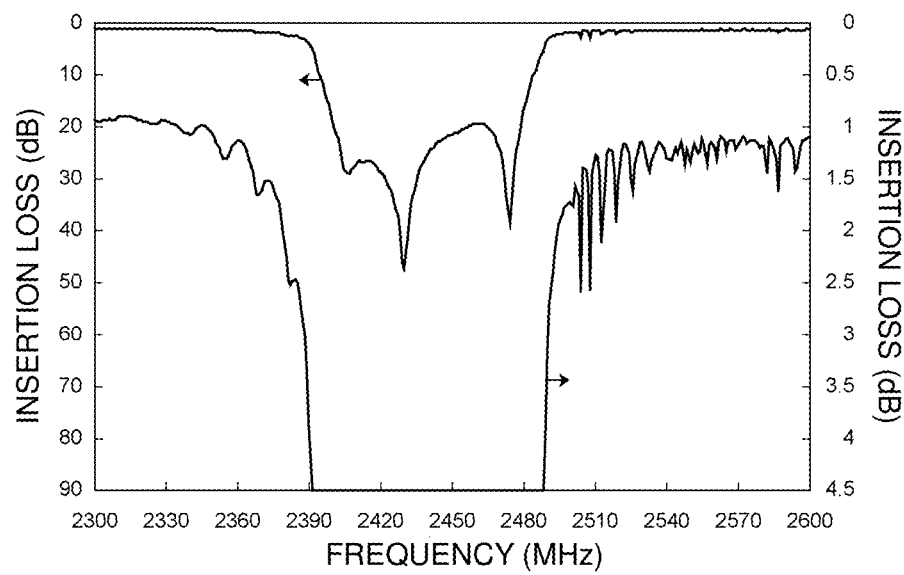
FIG. 14 is a diagram illustrating an attenuation-frequency characteristic of a second comparative example whose IR gap $G_{IR}$ is about $0.01\lambda$.
Figure 15:
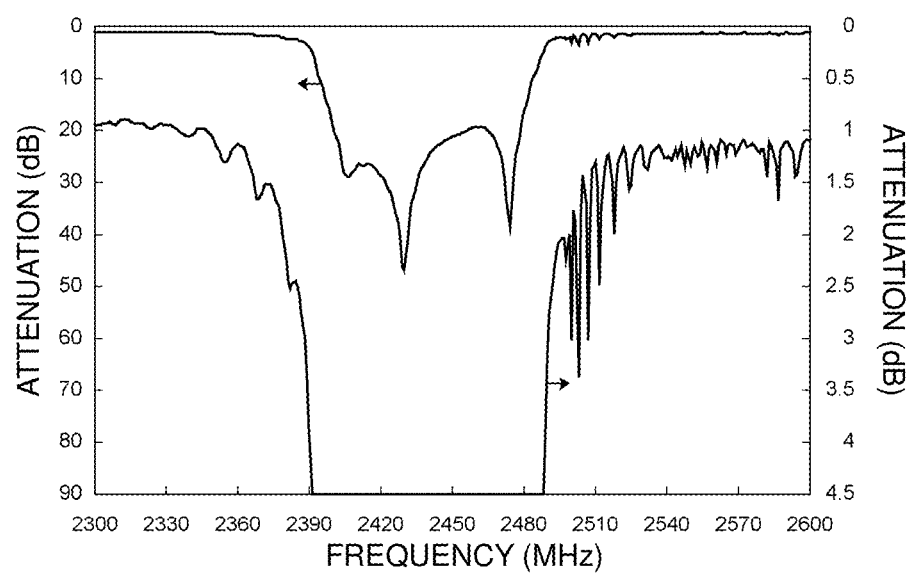
FIG. 15 is a diagram illustrating an attenuation-frequency characteristic of a third comparative example whose IR gap $G_{IR}$ is about $1\lambda$.

FIG. 5 is a diagram illustrating attenuation-frequency characteristics of the first preferred embodiment whose IR gap $G_{IR}$ is about 0.2λ and the first comparative example. FIG. 6 is a diagram illustrating attenuation-frequency characteristics of the first preferred embodiment whose IR gap $G_{IR}$ is about 0.3λ and the first comparative example. FIG. 7 is a diagram illustrating attenuation-frequency characteristics of the first preferred embodiment whose IR gap $G_{IR}$ is about 0.4λ and the first comparative example. FIG. 8 is a diagram illustrating attenuation-frequency characteristics of the first preferred embodiment whose IR gap $G_{IR}$ is about 0.45λ and the first comparative example. FIG. 9 is a diagram illustrating attenuation-frequency characteristics of the first preferred embodiment whose IR gap $G_{IR}$ is about 0.55λ and the first comparative example. FIG. 10 is a diagram illustrating attenuation-frequency characteristics of the first preferred embodiment whose IR gap $G_{IR}$ is about 0.6λ and the first comparative example. FIG. 11 is a diagram illustrating attenuation-frequency characteristics of the first preferred embodiment whose IR gap $G_{IR}$ is about 0.7λ and the first comparative example. FIG. 12 is a diagram illustrating attenuation-frequency characteristics of the first preferred embodiment whose IR gap $G_{IR}$ is about 0.8λ and the first comparative example. FIG. 13 is a diagram illustrating attenuation-frequency characteristics of the first preferred embodiment whose IR gap $G_{IR}$ is about 0.9λ and the first comparative example. FIG. 14 is a diagram illustrating an attenuation-frequency characteristic of the second comparative example whose IR gap $G_{IR}$ is about 0.01λ. FIG. 15 is a diagram illustrating an attenuation-frequency characteristic of the third comparative example whose IR gap $G_{IR}$ is 1λ.

As is the case illustrated in FIG. 4, as illustrated in FIG. 5 to FIG. 13, it is found that, when the IR gap $G_{IR}$ is within one of two ranges: $0.1λ ≤ G_{IR} < 0.5λ$ or $0.5λ < G_{IR} 0.9λ$, ripples are able to be significantly reduced or prevented in the passband.

Note that as illustrated in FIG. 14, in the second comparative example whose IR gap $G_{IR}$ is less than about 0.1λ, large ripples are generated in the passband. Similarly, as illustrated in FIG. 15, even in the third comparative example whose IR gap $G_{IR}$ is larger than about 0.9λ, large ripples are generated in the passband.

Preferably, for example, the IR gap $G_{IR}$ is within one of two ranges: $0.4λ ≤ G_{IR} < 0.5λ$ or $0.5λ < G_{IR} ≤ 0.6λ$. In this case, the interdigital transducer electrode and the reflector is able to be easily formed, thus improving productivity.

Preferably, for example, the IR gap $G_{IR}$ is within one of two ranges: $0.2λ ≤ G_{IR} ≤ 0.4λ$ or $0.6λ ≤ G_{IR} ≤ 0.8λ$. In this case, as illustrated in FIG. 5 to FIG. 7 and FIG. 10 to FIG. 12, ripples are able to be further significantly reduced or prevented in the passband.

Preferably, for example, the number of electrode fingers in the reflector is 21 or less, as described below with respect to FIG. 16 and FIG. 17.

A case where the number of electrode fingers in the reflector is 21 and a case where the number of electrode fingers in the reflector is 11 are compared. Further, a first reference example that does not include the reflector is also compared. Note that hereinafter the case where no reflector is included may be referred to as a case where the number of electrode fingers in the reflector is 0. The case where the IR gap $G_{IR}$ is about 0.45λ is illustrated in FIG. 16 below. The case where the IR gap $G_{IR}$ is about 0.55λ is illustrated in FIG. 17 below.

Figure 16:
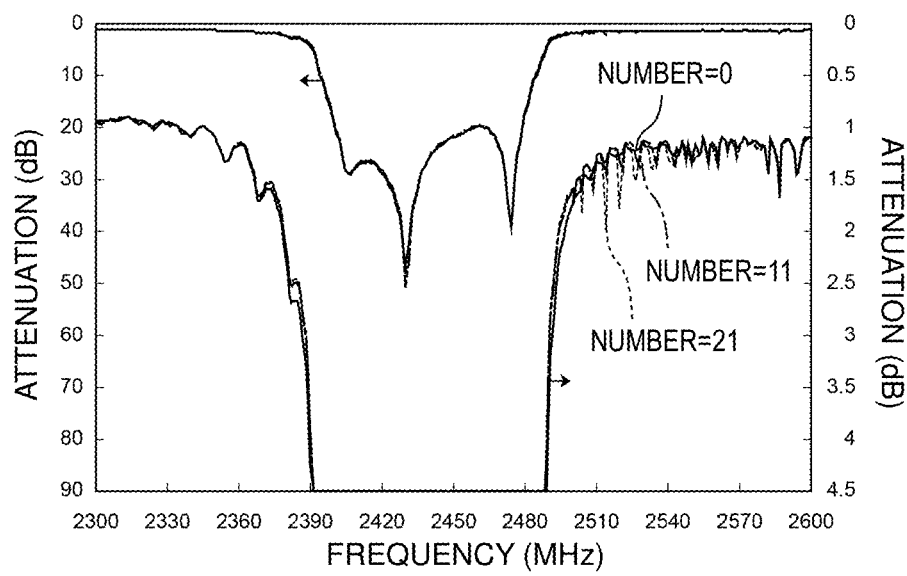
FIG. 16 is a diagram illustrating attenuation-frequency characteristics in the first preferred embodiment of the present invention and a first reference example when the IR gap $G_{IR}$ is about $0.45\lambda$ and the number of electrode fingers in a reflector is 21, 11, and 0.

FIG. 16 is a diagram illustrating attenuation-frequency characteristics in the first preferred embodiment and the first reference example when the IR gap $G_{IR}$ is about 0.45λ and the number of electrode fingers in the reflector is 21, 11, and 0. FIG. 17 is a diagram illustrating attenuation-frequency characteristics in the first preferred embodiment and the first reference example when the IR gap $G_{IR}$ is about 0.55λ and the number of electrode fingers in the reflector is 21, 11, and 0. In FIG. 16 and FIG. 17, the solid line represents a result when the number of electrode fingers in the reflector is 0, the dashed-dotted line represents a result when the number of electrode fingers in the reflector is 11, and the dashed line represents a result when the number of electrode fingers in the reflector is 21.

Figure 17:
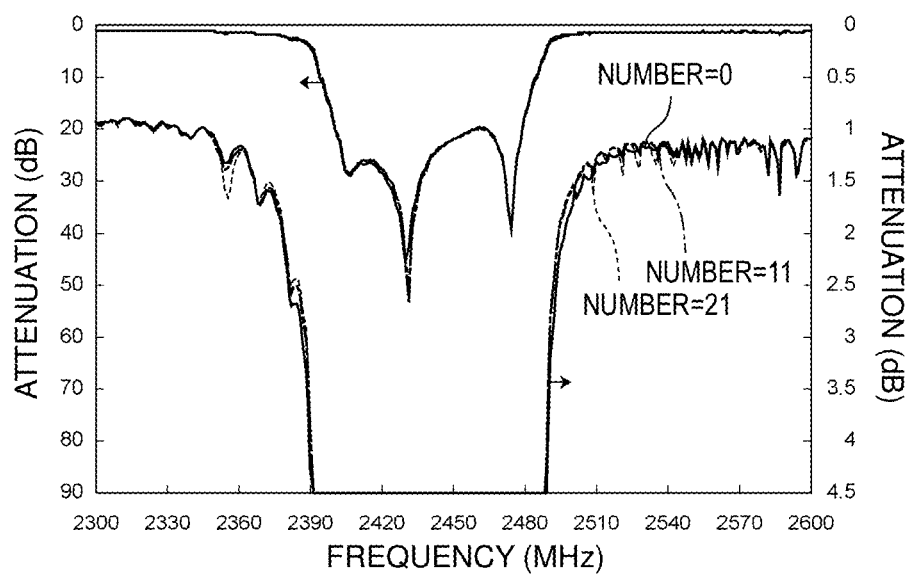
FIG. 17 is a diagram illustrating attenuation-frequency characteristics in the first preferred embodiment of the present invention and the first reference example when the IR gap $G_{IR}$ is about $0.55\lambda$ and the number of electrode fingers in the reflector is 21, 11, and 0.

As illustrated in FIG. 16 and FIG. 17, when the number of electrode fingers in the reflector is 21 or less, ripples in the passband are effectively reduced or prevented. Further, it is found the ripples are further significantly reduced or prevented as the number of electrode fingers becomes smaller. Reducing the number of electrode fingers in the reflector significantly reduces or prevents the generation of spurious emissions at the time when an acoustic wave leaked from the interdigital transducer electrode is reflected by the reflector. Accordingly, the stopband response in the passband is able to be further significantly reduced or prevented, and the ripples are able to be further significantly reduced or prevented.

Figure 18:
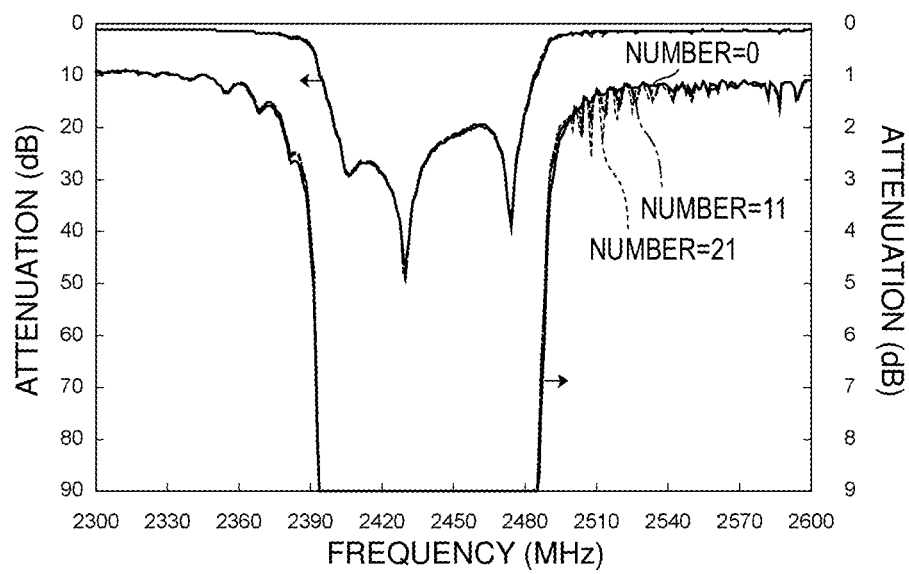
FIG. 18 is a diagram illustrating attenuation-frequency characteristics in a second reference example when the number of electrode fingers in the reflector is 21, 11, and 0.

FIG. 18 below illustrates a second reference example where the IR gap $G_{IR}$ is about 0.5λ and the number of electrode fingers in the reflector is 21 or less.

FIG. 18 is a diagram illustrating attenuation-frequency characteristics in the second reference example when the number of electrode fingers in the reflector is 21, 11, and 0.

As illustrated in FIG. 18, it is found that even when the IR gap $G_{IR}$ is about 0.5λ, the significantly reduction or prevention of ripples is able to be provided by setting the number of electrode fingers in the reflector at 21 or less.

Here, in the first preferred embodiment, $λ_R$ is about 1λ, where $λ_R$ is a wavelength determined by an electrode finger pitch of the reflector. In the following, a notch filter according to a second preferred embodiment is described, in which the wavelength $λ_R$ in the reflector is different from the wavelength λ in the interdigital transducer electrode.

In the second preferred embodiment, the wavelength $λ_R$ is within one of two ranges: $0.91λ ≤ λ_R < λ$ or $λ < λ_R ≤ 5λ$. With regard to points other than the above, the notch filter of the second preferred embodiment is the same as or similar to that of the notch filter 1 of the first preferred embodiment illustrated in FIG. 1. Note that λ and 1λ are the same value.

Figure 19:
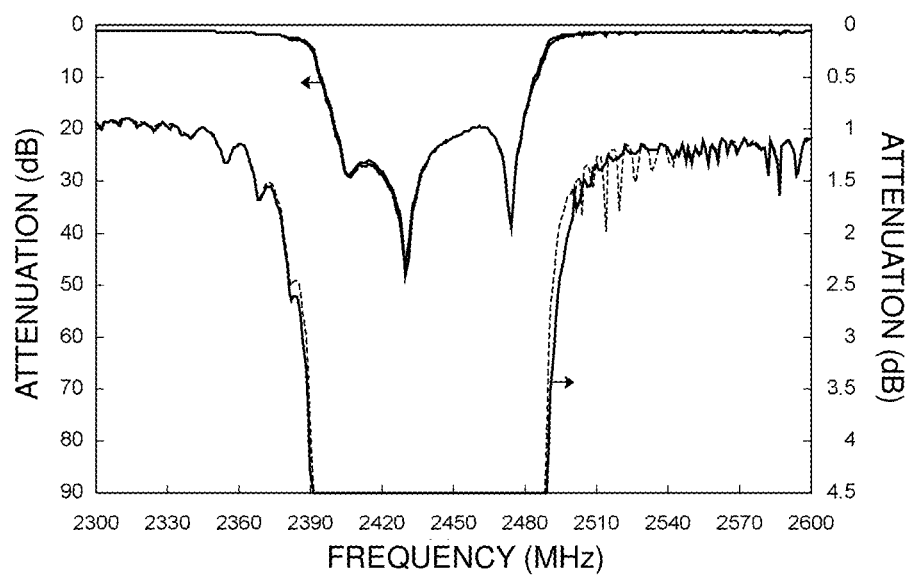
FIG. 19 is a diagram illustrating attenuation-frequency characteristics in a second preferred embodiment of the present invention when the IR gap $G_{IR}$ is about $0.45\lambda$ and a wavelength $\lambda_R$ in the reflector is about $1.1\lambda$ and when the IR gap $G_{IR}$ is about $0.45\lambda$ and the wavelength $\lambda_R$ in the reflector is about $1\lambda$.
Figure 20:
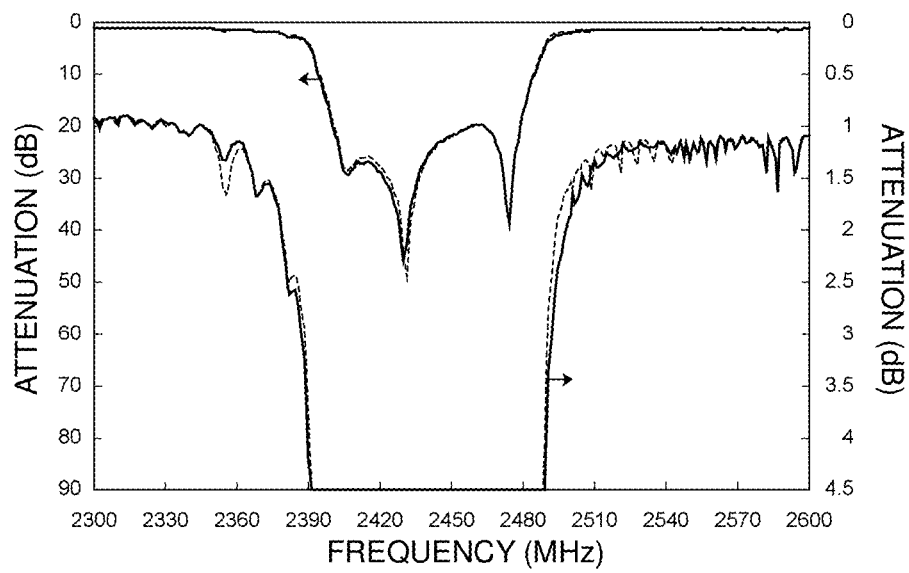
FIG. 20 is a diagram illustrating attenuation-frequency characteristics in the second preferred embodiment of the present invention when the IR gap $G_{IR}$ is about $0.55\lambda$ and the wavelength $\lambda_R$ in the reflector is about $1.1\lambda$ and when the IR gap $G_{IR}$ is about $0.55\lambda$ and the wavelength $\lambda_R$ in the reflector is about $1\lambda$.

FIG. 19 is a diagram illustrating attenuation-frequency characteristics in the second preferred embodiment when the IR gap $G_{IR}$ is about 0.45λ and the wavelength $λ_R$ in the reflector is about 1.1λ and when the IR gap $G_{IR}$ is about 0.45λ and the wavelength $λ_R$ in the reflector is about 1λ. FIG. 20 is a diagram illustrating attenuation-frequency characteristics in the second preferred embodiment when the IR gap $G_{IR}$ is about 0.55, and the wavelength $λ_R$ in the reflector is about 1.1λ and when the IR gap $G_{IR}$ is about 0.55λ and the wavelength $λ_R$ in the reflector is about 1λ. In FIG. 19 and FIG. 20, the solid line represents a result when the wavelength $λ_R$ is about 1.1λ, and the dashed line represents a result when the wavelength $λ_R$ is about 1λ.

As illustrated in FIG. 19 and FIG. 20, in the second preferred embodiment represented by the solid line, ripples in the passband are further significantly reduced or prevented. In the second preferred embodiment, the wavelength $λ_R$ in the reflector is different from the wavelength λ in the interdigital transducer electrode, which significantly reduces or prevents an increase in strength of spurious emissions generated when an acoustic wave leaked from the interdigital transducer electrode is reflected by the reflector. Accordingly, the stopband response in the passband is able to be further significantly reduced or prevented, and the ripples are able to be further significantly reduced or prevented.

In the following, the attenuation-frequency characteristics are compared by varying the wavelength $λ_R$ in the reflector. In FIG. 21 to FIG. 27 below, respective results of the cases where the IR gap $G_{IR}$ is about 0.452 are illustrated. In FIG. 28 to FIG. 34 below, respective results of the cases where the IR gap $G_{IR}$ is about 0.55λ are illustrated.

Figure 21:
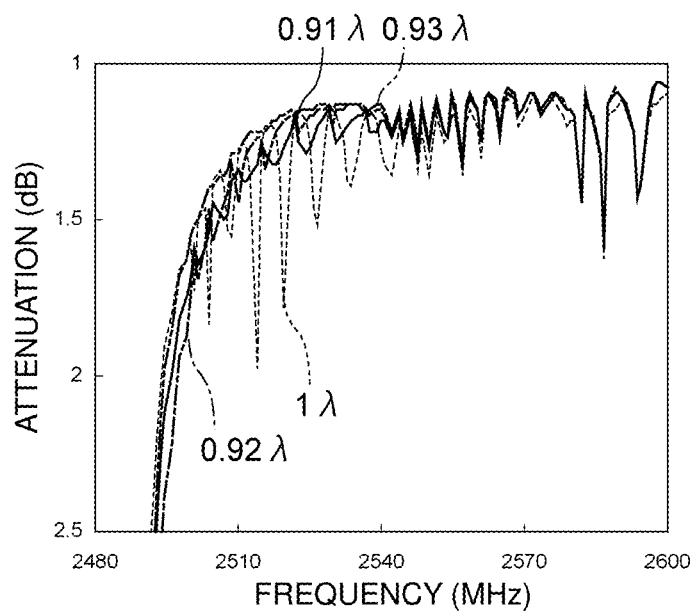
FIG. 21 is a diagram illustrating attenuation-frequency characteristics in the second preferred embodiment of the present invention in the vicinity of a passband when the IR gap $G_{IR}$ is about $0.45\lambda$ and the wavelength $\lambda_R$ in the reflector is about $0.91\lambda$, about $0.92\lambda$, and about $0.93\lambda$ and when the IR gap $G_{IR}$ is about $0.45\lambda$ and the wavelength $\lambda_R$ in the reflector is about $1\lambda$.
Figure 22:
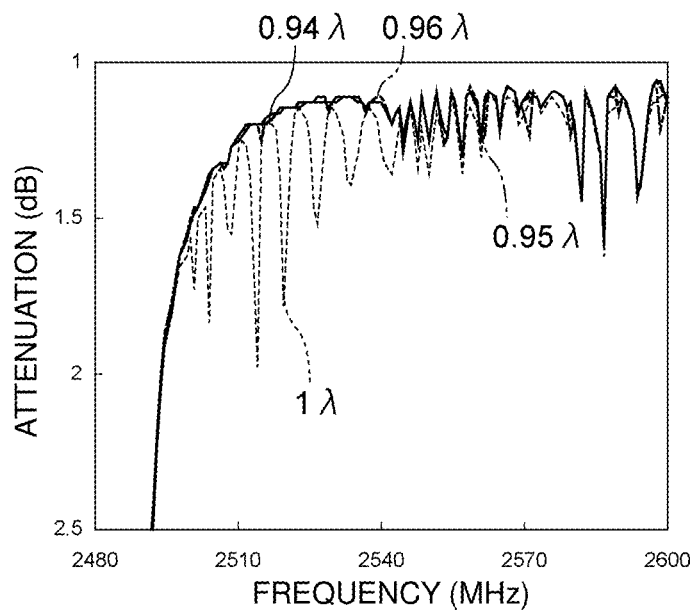
FIG. 22 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $0.94\lambda$, about $0.95\lambda$, and about $0.96\lambda$ and when the IR gap $G_{IR}$ is about $0.45\lambda$ and the wavelength $\lambda_R$ in the reflector is about $1\lambda$.
Figure 23:
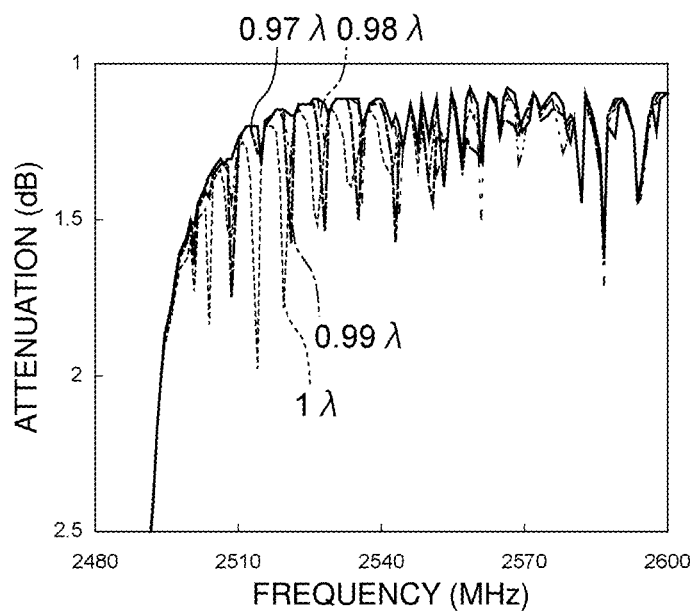
FIG. 23 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $0.97\lambda$, about $0.98\lambda$, and about $0.99\lambda$ and when the IR gap $G_{IR}$ is about $0.45\lambda$ and the wavelength $\lambda_R$ in the reflector is about $1\lambda$.

FIG. 21 is a diagram illustrating attenuation-frequency characteristics in the second preferred embodiment in the vicinity of the passband when the IR gap $G_{IR}$ is about 0.45λ and the wavelength $λ_R$ in the reflector is about 0.91λ, about 0.92λ, and about 0.93λ and when the IR gap $G_{IR}$ is about 0.45λ and the wavelength $λ_R$ in the reflector is about 1λ. FIG. 22 is a diagram illustrating attenuation-frequency characteristics in the second preferred embodiment in the vicinity of the passband when the IR gap $G_{IR}$ is about 0.45λ and the wavelength $λ_R$ in the reflector is about 0.94λ, about 0.95λ, and about 0.96λ and when the IR gap $G_{IR}$ is about 0.45λ and the wavelength $λ_R$ in the reflector is about 1λ. FIG. 23 is a diagram illustrating attenuation-frequency characteristics in the second preferred embodiment in the vicinity of the passband when the IR gap $G_{IR}$ is about 0.45λ and the wavelength $λ_R$ in the reflector is about 0.97λ, about 0.98λ, and about 0.99λ and when the IR gap $G_{IR}$ is about 0.45λ and the wavelength $λ_R$ in the reflector is about 1λ.

Figure 24:
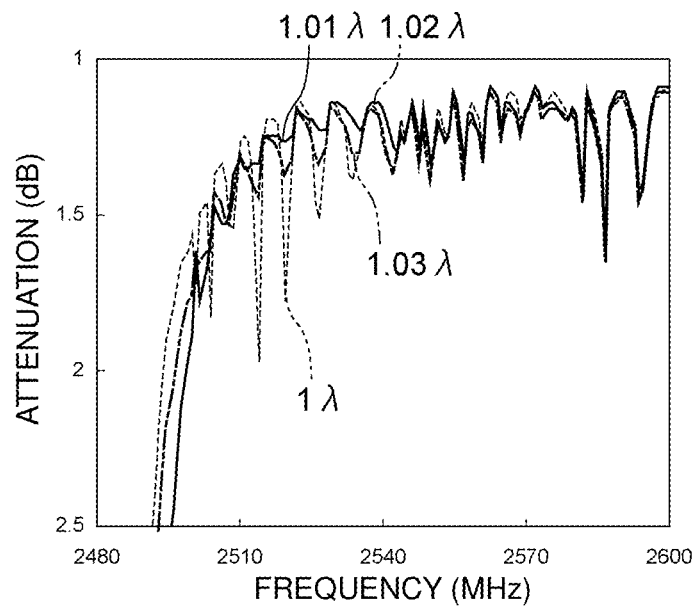
FIG. 24 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $1.01\lambda$, about $1.02\lambda$, and about $1.03\lambda$ and when the IR gap $G_{IR}$ is about $0.45\lambda$ and the wavelength $\lambda_R$ in the reflector is about $1\lambda$.

FIG. 24 is a diagram illustrating attenuation-frequency characteristics in the second preferred embodiment in the vicinity of the passband when the IR gap $G_{IR}$ is about 0.45λ and the wavelength $λ_R$ in the reflector is about 1.01λ, about 1.02λ, and about 1.03λ and when the IR gap $G_{IR}$ is about 0.45λ and the wavelength $λ_R$ in the reflector is about 1λ.

Figure 25:
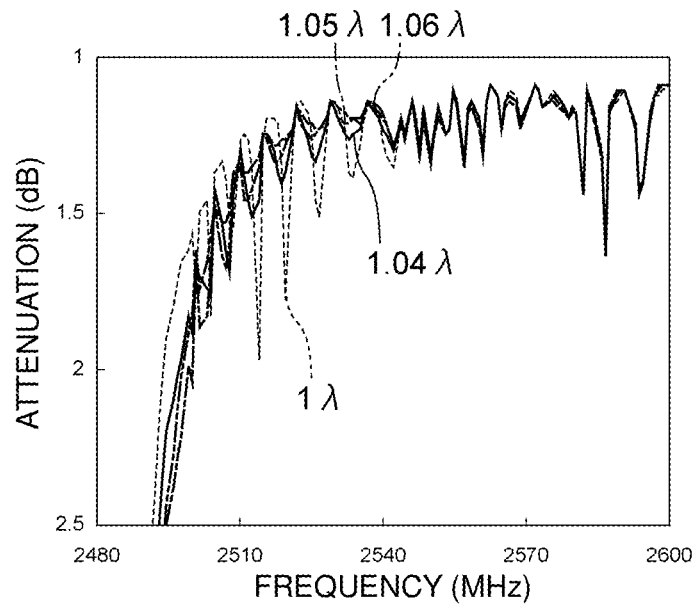
FIG. 25 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $1.04\lambda$, about $1.05\lambda$, and about $1.06\lambda$ and when the IR gap $G_{IR}$ is about $0.45\lambda$ and the wavelength $\lambda_R$ in the reflector is about $1\lambda$.

FIG. 25 is a diagram illustrating attenuation-frequency characteristics in the second preferred embodiment in the vicinity of the passband when the IR gap $G_{IR}$ is about 0.45λ and the wavelength $λ_R$ in the reflector is about 1.04λ, about 1.05λ, and about 1.06λ and when the IR gap $G_{IR}$ is about 0.45λ and the wavelength $λ_R$ in the reflector is about 1λ.

Figure 26:
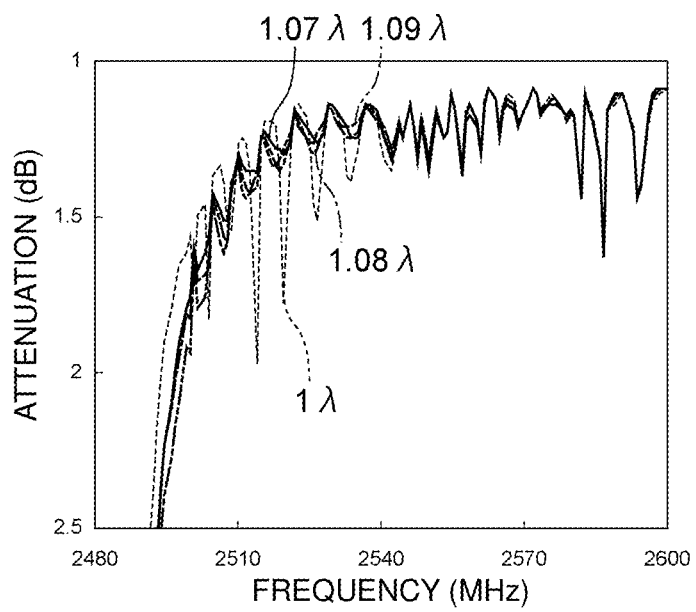
FIG. 26 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $1.07\lambda$, about $1.08\lambda$, and about $1.09\lambda$ and when the IR gap $G_{IR}$ is about $0.45\lambda$ and the wavelength $\lambda_R$ in the reflector is about $1\lambda$.

FIG. 26 is a diagram illustrating attenuation-frequency characteristics in the second preferred embodiment in the vicinity of the passband when the IR gap $G_{IR}$ is about 0.45λ and the wavelength $λ_R$ in the reflector is about 1.07λ, about 1.08λ, and about 1.09λ and when the IR gap $G_{IR}$ is about 0.45λ and the wavelength $λ_R$ in the reflector is about 1λ.

Figure 27:
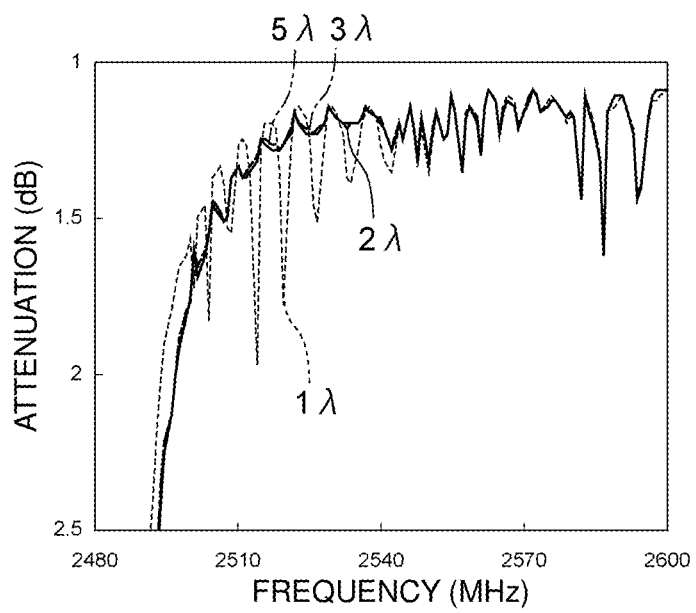
FIG. 27 is a diagram illustrating attenuation-frequency characteristics in the second preferred embodiment of the present invention in the vicinity of the passband when the IR gap $G_{IR}$ is about $0.45\lambda$ and the wavelength $\lambda_R$ in the reflector is about $2\lambda$, about $3\lambda$, and about $5\lambda$ and when the IR gap $G_{IR}$ is about $0.45\lambda$ and the wavelength $\lambda_R$ in the reflector is about $1\lambda$.

FIG. 27 is a diagram illustrating attenuation-frequency characteristics in the second preferred embodiment in the vicinity of the passband when the IR gap $G_{IR}$ is about 0.45λ and the wavelength $λ_R$ in the reflector is about 2λ, about 3λ, and about 5λ and when the IR gap $G_{IR}$ is about 0.45λ and the wavelength $λ_R$ in the reflector is about 1λ. In FIG. 21 to FIG. 27, the solid line, the dashed-dotted line, and the dashed-two dotted line represent results of the second preferred embodiment, and the dashed line represents a result when the wavelength $λ_R$ is 1λ.

Figure 28:
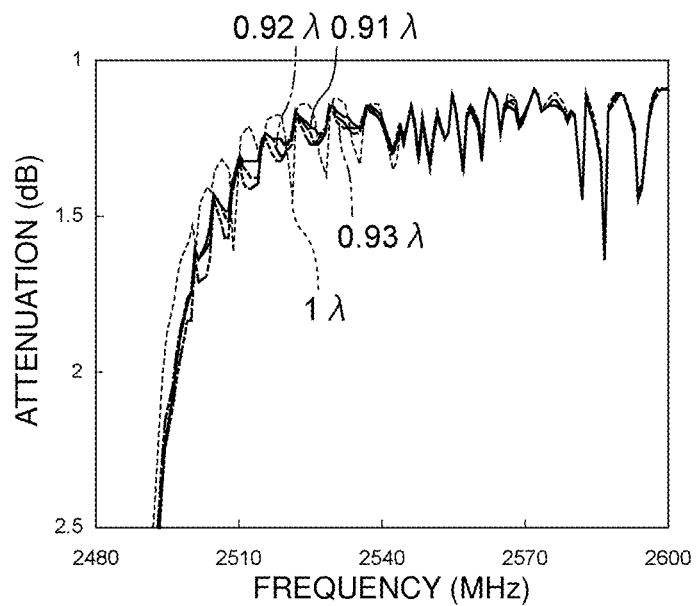
FIG. 28 is a diagram illustrating attenuation-frequency characteristics in the second preferred embodiment of the present invention in the vicinity of the passband when the IR gap $G_{IR}$ is about $0.55\lambda$ and the wavelength $\lambda_R$ in the reflector is about $0.91\lambda$, about $0.92\lambda$, and about $0.93\lambda$ and when the IR gap $G_{IR}$ is about $0.55\lambda$ and the wavelength $\lambda_R$ in the reflector is about $1\lambda$.

FIG. 28 is a diagram illustrating attenuation-frequency characteristics in the second preferred embodiment in the vicinity of the passband when the IR gap $G_{IR}$ is about 0.55λ and the wavelength $λ_R$ in the reflector is about 0.91λ, about 0.92λ, and about 0.93λ and when the IR gap $G_{IR}$ is about 0.55λ and the wavelength $λ_R$ in the reflector is about 1λ.

Figure 29:
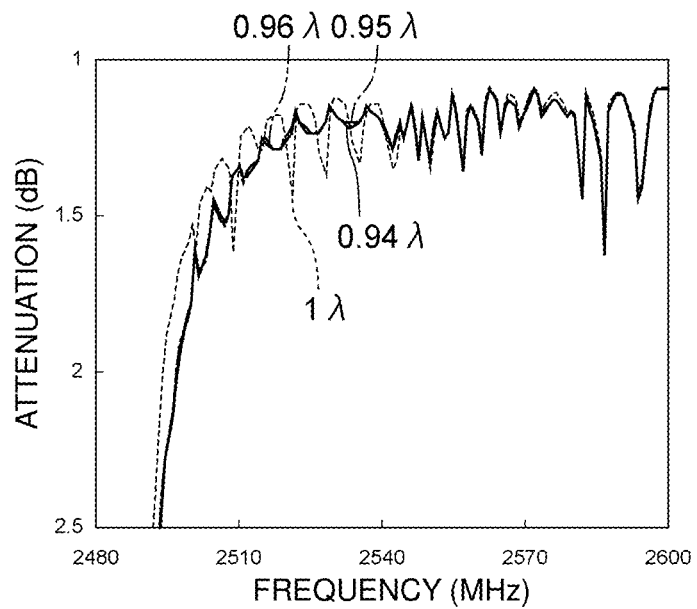
FIG. 29 is a diagram illustrating attenuation-frequency characteristics in the second preferred embodiment of the present invention in the vicinity of the passband when the IR gap $G_{IR}$ is about $0.55\lambda$ and the wavelength $\lambda_R$ in the reflector is about $0.94\lambda$, about $0.95\lambda$, and about $0.96\lambda$ and when the IR gap $G_{IR}$ is about $0.55\lambda$ and the wavelength $\lambda_R$ in the reflector is about $1\lambda$.

FIG. 29 is a diagram illustrating attenuation-frequency characteristics in the second preferred embodiment in the vicinity of the passband when the IR gap $G_{IR}$ is about 0.55λ and the wavelength $λ_R$ in the reflector is about 0.94λ, about 0.95λ, and about 0.96λ and when the IR gap $G_{IR}$ is about 0.55λ and the wavelength $λ_R$ in the reflector is about 1λ.

Figure 30:
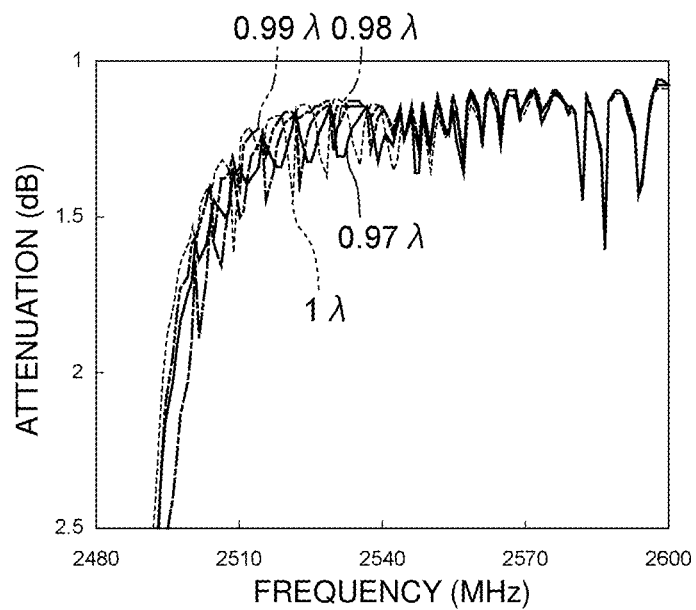
FIG. 30 is a diagram illustrating attenuation-frequency characteristics in the second preferred embodiment of the present invention in the vicinity of the passband when the IR gap $G_{IR}$ is about $0.55\lambda$ and the wavelength $\lambda_R$ in the reflector is about $0.97\lambda$, about $0.98\lambda$, and about $0.99\lambda$ and when the IR gap $G_{IR}$ is about $0.55\lambda$ and the wavelength $\lambda_R$ in the reflector is about $1\lambda$.

FIG. 30 is a diagram illustrating attenuation-frequency characteristics in the second preferred embodiment in the vicinity of the passband when the IR gap $G_{IR}$ is about 0.55λ and the wavelength $λ_R$ in the reflector is about 0.97λ, about 0.98λ, and about 0.99λ and when the IR gap $G_{IR}$ is about 0.55λ and the wavelength $λ_R$ in the reflector is about 1λ.

Figure 31:
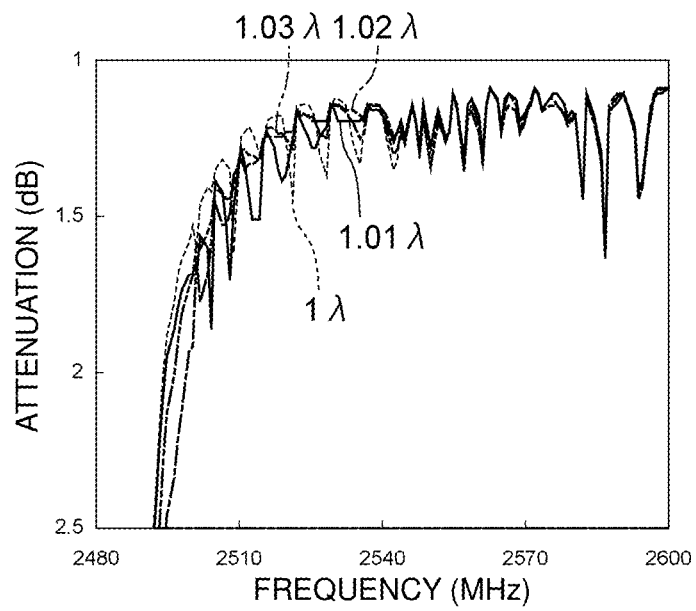
FIG. 31 is a diagram illustrating attenuation-frequency characteristics in the second preferred embodiment of the present invention in the vicinity of the passband when the IR gap $G_{IR}$ is about $0.55\lambda$ and the wavelength $\lambda_R$ in the reflector is about 1.01λ, about 1.02λ, and about 1.03λ and when the IR gap $G_{IR}$ is about 0.55λ and the wavelength $\lambda_R$ in the reflector is about 1λ.

FIG. 31 is a diagram illustrating attenuation-frequency characteristics in the second preferred embodiment in the vicinity of the passband when the IR gap $G_{IR}$ is about 0.55λ and the wavelength $λ_R$ in the reflector is about 1.01λ, about 1.02λ, and about 1.03λ and when the IR gap $G_{IR}$ is about 0.55λ and the wavelength $λ_R$ in the reflector is about 1λ.

Figure 32:
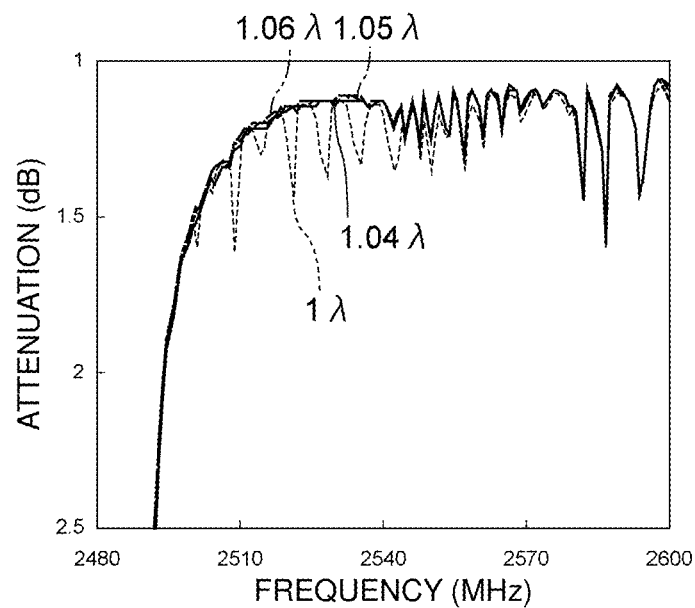
FIG. 32 is a diagram illustrating attenuation-frequency characteristics in the second preferred embodiment of the present invention in the vicinity of the passband when the IR gap $G_{IR}$ is about 0.55λ and the wavelength $\lambda_R$ in the reflector is about 1.04λ, about 1.05λ, and about 1.06λ and when the IR gap $G_{IR}$ is about 0.55λ and the wavelength $\lambda_R$ in the reflector is about 1λ.

FIG. 32 is a diagram illustrating attenuation-frequency characteristics in the second preferred embodiment in the vicinity of the passband when the IR gap $G_{IR}$ is about 0.55λ and the wavelength $λ_R$ in the reflector is about 1.04λ, about 1.05λ, and about 1.06λ and when the IR gap $G_{IR}$ is about 0.55λ and the wavelength $λ_R$ in the reflector is about 1λ.

Figure 33:
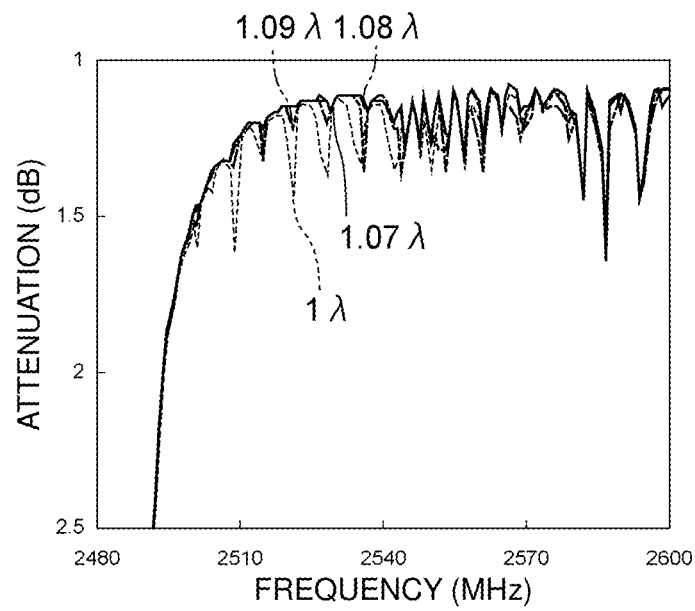
FIG. 33 is a diagram illustrating attenuation-frequency characteristics in the second preferred embodiment of the present invention in the vicinity of the passband when the IR gap $G_{IR}$ is about 0.55λ and the wavelength $\lambda_R$ in the reflector is about 1.07λ, about 1.08λ, and about 1.09λ and when the IR gap $G_{IR}$ is about 0.55λ and the wavelength $\lambda_R$ in the reflector is about 1λ.

FIG. 33 is a diagram illustrating attenuation-frequency characteristics in the second preferred embodiment in the vicinity of the passband when the IR gap $G_{IR}$ is about 0.55λ and the wavelength $λ_R$ in the reflector is about 1.07λ, about 1.08λ, and about 1.09λ and when the IR gap $G_{IR}$ is about 0.55λ and the wavelength $λ_R$ in the reflector is about 1λ.

Figure 34:
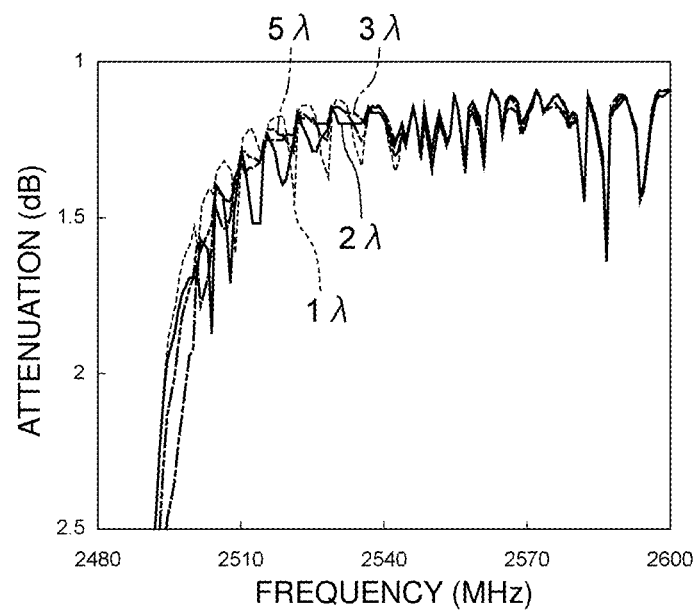
FIG. 34 is a diagram illustrating attenuation-frequency characteristics in the second preferred embodiment of the present invention in the vicinity of the passband when the IR gap $G_{IR}$ is about 0.55λ and the wavelength $\lambda_R$ in the reflector is about 2λ, about 3λ, and about 5λ and when the IR gap $G_{IR}$ is about 0.55λ and the wavelength $\lambda_R$ in the reflector is about 1λ.

FIG. 34 is a diagram illustrating attenuation-frequency characteristics in the second preferred embodiment in the vicinity of the passband when the IR gap $G_{IR}$ is about 0.55λ and the wavelength $λ_R$ in the reflector is about 2λ, about 3λ, and about 5λ and when the IR gap $G_{IR}$ is about 0.55λ and the wavelength $λ_R$ in the reflector is about 1λ. In FIG. 28 to FIG. 34, the solid line, the dashed-dotted line, and the dashed-two dotted line represent results of the second preferred embodiment, and the dashed line represents a result when the wavelength $λ_R$ is 1λ.

As respectively illustrated in FIG. 21 to FIG. 34, it is found that ripples in the passband are further significantly reduced or prevented in the second preferred embodiment.

Figure 35:
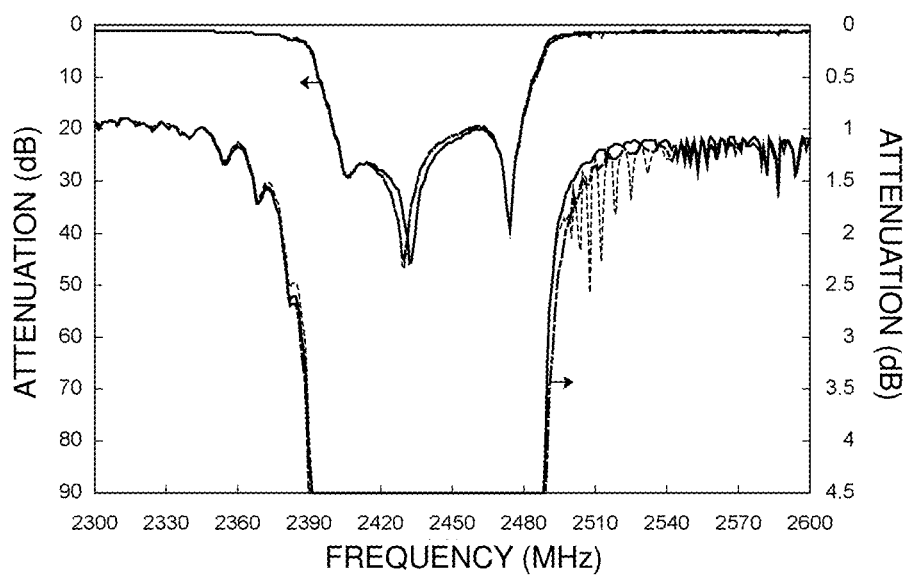
FIG. 35 is a diagram illustrating attenuation-frequency characteristics in a third reference example when the wavelength $\lambda_R$ in the reflector is about 0.95λ and about 1.1λ and when the wavelength $\lambda_R$ in the reflector is about 1λ.

FIG. 35 illustrates a third reference example in which the IR gap $G_{IR}$ is about 0.5λ and the wavelength $λ_R$ in the reflector is within one of two ranges: $0.91λ ≤ λ_R < λ$ or $λ < λ_R ≤ 5λ$.

FIG. 35 is a diagram illustrating attenuation-frequency characteristics in the third reference example when the wavelength $λ_R$ in the reflector is about 0.95λ and about 1.1λ and when the wavelength $λ_R$ in the reflector is about 1λ. In FIG. 35, the solid line represents a result when the wavelength $λ_R$ is about 0.95λ, the dashed-dotted line represents a result when the wavelength $λ_R$ is about 1.1λ, and the dashed line represents a result when the wavelength $λ_R$ is about 1λ.

As illustrated in FIG. 35, it is found that even when the IR gap $G_{IR}$ is about 0.5λ, a significantly reduction or prevention of ripples in the passband is able to be provided by setting the wavelength $λ_R$ in the reflector at within one of two ranges: $0.91λ ≤ λ_R < λ$ or $λ < λ_R ≤ 5λ$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A notch filter comprising:
   a substrate having piezoelectricity, the substrate including a high-acoustic-velocity member, a low-acoustic-velocity film provided on the high-acoustic-velocity member, and a piezoelectric thin film provided on the low-acoustic-velocity film;
   an interdigital transducer electrode provided on the piezoelectric thin film of the substrate having piezoelectricity; and
   reflectors provided on two sides of the interdigital transducer electrode in an acoustic wave propagation direction on the piezoelectric thin film of the substrate having piezoelectricity; wherein
   an acoustic velocity of a bulk wave propagating in the low-acoustic-velocity film is lower than an acoustic velocity of an acoustic wave propagating in the piezoelectric thin film;
   an acoustic velocity of a bulk wave propagating in the high-acoustic-velocity member is higher than the acoustic velocity of an acoustic wave propagating in the piezoelectric thin film;
   the interdigital transducer electrode and the reflectors each include electrode fingers; and
   an IR gap $G_{IR}$ is within one of two ranges: $0.1λ ≤ G_{IR} < 0.5λ$ or $0.5λ < G_{IR} ≤ 0.9λ$, where λ is a wavelength determined by an electrode finger pitch of the interdigital transducer electrode, and the IR gap $G_{IR}$ is a distance between electrode finger centers of an electrode finger of the interdigital transducer electrode closest to at least one of the reflectors, of the electrode fingers of the interdigital transducer electrode, and an electrode finger of the at least one reflector closest to the interdigital transducer electrode, of the electrode fingers of the at least one reflector.

2. The notch filter according to claim 1, wherein the IR gap $G_{IR}$ is within one of two ranges: $0.4\lambda \leq G_{IR} < 0.5\lambda$ or $0.5\lambda < G_{IR} \leq 0.6\lambda$.

3. The notch filter according to claim 1, wherein the IR gap $G_{IR}$ is within one of two ranges: $0.2\lambda \leq G_{IR} \leq 0.4\lambda$ or $0.6\lambda \leq G_{IR} \leq 0.8\lambda$.

4. The notch filter according to claim 1, wherein number of the electrode fingers of the at least one reflector is 21 or less.

5. The notch filter according to claim 1, wherein $0.91\lambda \leq \lambda_R \leq 5\lambda$ is satisfied, where $\lambda_R$ is a wavelength determined by an electrode finger pitch of the at least one reflector.

6. The notch filter according to claim 1, wherein
the high-acoustic-velocity member includes a supporting substrate and a high-acoustic-velocity film provided on the supporting substrate; and
an acoustic velocity of a bulk wave propagating in the high-acoustic-velocity film is higher than an acoustic velocity of an acoustic wave propagating in the piezoelectric thin film.

7. The notch filter according to claim 1, wherein the piezoelectric thin film includes $LiTaO_3$.

8. The notch filter according to claim 1, wherein the low-acoustic-velocity film includes $SiO_2$.

9. The notch filter according to claim 1, wherein the high-acoustic-velocity member is a high-acoustic-velocity substrate including Si.

10. The notch filter according to claim 1, wherein
the interdigital transducer electrode and the reflectors define a first acoustic wave resonator; and
the first acoustic wave resonator is a one-port acoustic wave resonator.

11. The notch filter according to claim 10, further comprising:
additional interdigital transducer electrodes that define a second acoustic wave resonator and a third acoustic wave resonator; wherein
the first acoustic wave resonator and the second acoustic wave resonator are electrically connected to each other in series; and
the third acoustic wave resonator is electrically connected between a ground potential and a connection point between the first acoustic wave resonator and the second acoustic wave resonator.

12. The notch filter according to claim 11, wherein an inductor is electrically connected in parallel with the third acoustic wave resonator.

13. The notch filter according to claim 1, wherein the interdigital transducer electrode and the reflectors are defined by a multilayer metal film in which a plurality of metal layers are stacked or by a single layer metal film.

* * * * *